(12) United States Patent
Tang et al.

(10) Patent No.: US 7,829,359 B2
(45) Date of Patent: Nov. 9, 2010

(54) METHOD FOR FABRICATING HIGHLY REFLECTIVE OHMIC CONTACT IN LIGHT-EMITTING DEVICES

(75) Inventors: Yingwen Tang, Nanchang (CN); Li Wang, Jiang Xi (CN); Fengyi Jiang, Jiang Xi (CN)

(73) Assignee: Lattice Power (Jiangxi) Corporation, Nanchang (CN)

( * ) Notice: Subject to any disclaimer, the term of this patent is extended or adjusted under 35 U.S.C. 154(b) by 364 days.

(21) Appl. No.: 12/093,512

(22) PCT Filed: Mar. 26, 2008

(86) PCT No.: PCT/CN2008/000598

§ 371 (c)(1),
(2), (4) Date: May 13, 2008

(87) PCT Pub. No.: WO2009/117850

PCT Pub. Date: Oct. 1, 2009

(65) Prior Publication Data

US 2010/0207096 A1 Aug. 19, 2010

(51) Int. Cl.
*H01L 21/00* (2006.01)
(52) U.S. Cl. ............... 438/29; 438/22; 257/E21.535
(58) Field of Classification Search ............... 438/22, 438/29
See application file for complete search history.

(56) References Cited

U.S. PATENT DOCUMENTS

| 6,936,863 | B2 * | 8/2005 | Udagawa et al. ............ 257/103 |
| 2001/0042866 | A1 | 11/2001 | Coman | |
| 2006/0035398 | A1 | 2/2006 | Ying | |
| 2008/0230799 | A1 * | 9/2008 | Wang et al. .................... 257/99 |
| 2009/0194784 | A1 * | 8/2009 | Kaji et al. .................... 257/103 |
| 2009/0242897 | A1 * | 10/2009 | Bergmann et al. ............ 257/76 |
| 2009/0275154 | A1 * | 11/2009 | Suzuki et al. ................. 438/29 |

* cited by examiner

*Primary Examiner*—Alexander G Ghyka
(74) *Attorney, Agent, or Firm*—Park, Vaughan, Fleming & Dowler LLP

(57) ABSTRACT

One embodiment of the present invention provides a method for fabricating a highly reflective electrode in a light-emitting device. During the fabrication process, a multilayer semiconductor structure is fabricated on a growth substrate, wherein the multilayer semiconductor structure includes a first doped semiconductor layer, a second doped semiconductor layer, and/or a multi-quantum-wells (MQW) active layer. The method further includes the followings operations: forming a contact-assist metal layer on the first doped semiconductor layer, annealing the multilayer structure to activate the first doped semiconductor layer, removing the contact-assist metal layer, forming a reflective ohmic-contact metal layer on the first doped semiconductor layer, forming a bonding layer coupled to the reflective ohmic-contact metal layer, bonding the multilayer structure to a conductive substrate, removing the growth substrate, forming a first electrode coupled to the conductive substrate, and forming a second electrode on the second doped semiconductor layer.

11 Claims, 3 Drawing Sheets

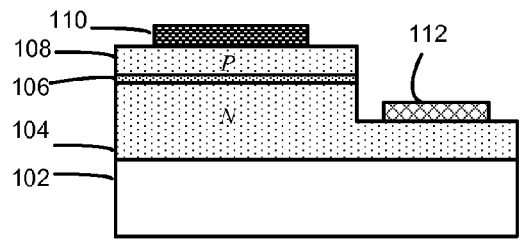
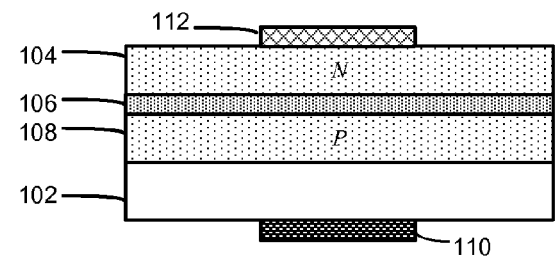
**FIG. 1A
(PRIOR ART)**
**FIG. 1B
(PRIOR ART)**
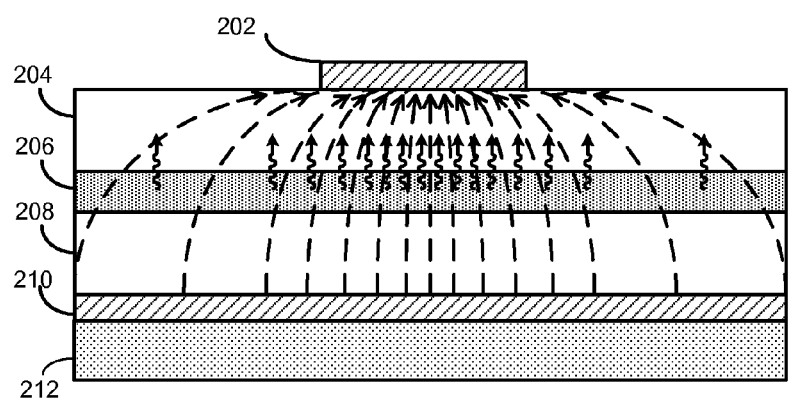
**FIG. 2
(PRIOR ART)**

METHOD FOR FABRICATING HIGHLY REFLECTIVE OHMIC CONTACT IN LIGHT-EMITTING DEVICES

This application is a U.S. National Stage application under 35 U.S.C. section 371 of PCT Application No. PCT/CN2008/000598, entitled "METHOD FOR FABRICATING HIGHLY REFLECTIVE OHMIC CONTACT IN LIGHT-EMITTING DEVICES," by inventors Yingwen Tang, Li Wang, and Fengyi Jiang, filed 26 Mar. 2008.

BACKGROUND

1. Field of the Invention

The present invention relates to the design of semiconductor light-emitting devices. More specifically, the present invention relates to novel semiconductor light-emitting devices with highly reflective ohmic contact.

2. Related Art

Solid-state lighting is expected to bring the next wave of illumination technologies. High-brightness light-emitting diodes (HB-LEDs) are emerging in an increasing number of applications, from serving as the light source for display devices to replacing light bulbs for conventional lighting. Typically, cost, efficiency, and brightness are the three foremost metrics for determining the commercial viability of LEDs.

An LED produces light from an active region, which is "sandwiched" between a positively doped layer (p-type doped layer) and a negatively doped layer (n-type doped layer). When the LED is forward-biased, the carriers, which include holes from the p-type doped layer and electrons from the n-type doped layer, recombine in the active region. In direct band-gap materials, this recombination process releases energy in the form of photons, or light, whose wavelength corresponds to the energy band-gap of the material in the active region.

Depending on the selection of the substrate and the design of the semiconductor layer stack, an LED can be formed using two configurations, namely the lateral-electrode (electrodes are positioned on the same side of the substrate) configuration and the vertical-electrode (electrodes are positioned on opposite sides of the substrate) configuration. FIGS. 1A and 1B illustrate both configurations, where FIG. 1A shows the cross-section of a typical lateral-electrode LED and FIG. 1B shows the cross-section of a typical vertical-electrode LED. Both of the LEDs shown in FIGS. 1A and 1B include a substrate layer 102, an n-type doped layer 104, a multi-quantum-well (MQW) active layer 106, a p-type doped layer 108, a p-side electrode 110 coupled to the p-type doped layer, and an n-side electrode 112 coupled to the n-type doped layer.

The vertical-electrode configuration makes the packaging of the device easier. In addition, because the electrodes are located on opposite sides of the device, the device is more resistant to electrostatic discharge. Therefore, a vertical-electrode LED has a higher stability compared with a lateral-electrode LED. This is especially true for high-power, short-wavelength LEDs.

In order to extract light effectively from a high-power high-brightness LED, a flip-chip packaging technique is often adopted, in which the p-side electrode is used as a highly reflective surface to reflect light to the opposite side of the device. The presence of a light reflector increases the light extraction efficiency of the LED. FIG. 2 illustrates an exemplary structure of a flip-chip packaged vertical LED with the p-electrode as a reflector. From top down, FIG. 2 shows an n-side electrode 202, an n-type doped layer 204, an active layer 206, a p-type doped layer 208, a p-side electrode 210 which also acts as a reflector, and a supporting substrate 212. The arrows in dashed lines show the direction of the current flow, and the short arrows pointing upward show the direction of the extracted light. Note that unlike laser devices, in which emitted light is guided and propagates in a well-defined direction, the light emitted in an LED propagates omni-directionally. Hence, the reflector at the bottom of the device is essential in increasing the light extraction efficiency.

SUMMARY

One embodiment of the present invention provides a method for fabricating a highly reflective electrode in a light-emitting device. During the fabrication process, a multilayer semiconductor structure is fabricated on a growth substrate, wherein the multilayer semiconductor structure includes a first doped semiconductor layer, a second doped semiconductor layer, and/or a multi-quantum-wells (MQW) active layer. The method further includes the followings operations: forming a contact-assist metal layer on the first doped semiconductor layer, annealing the multilayer structure to activate the first doped semiconductor layer, removing the contact-assist metal layer, forming a reflective ohmic-contact metal layer on the first doped semiconductor layer, forming a bonding layer coupled to the reflective ohmic-contact metal layer, bonding the multilayer structure to a conductive substrate, removing the growth substrate, forming a first electrode coupled to the conductive substrate, and forming a second electrode on the second doped semiconductor layer.

In a variation on this embodiment, the growth substrate comprises a pre-defined pattern of grooves and mesas.

In a variation on this embodiment, the first doped semiconductor layer is a p-type doped semiconductor layer.

In a further variation on this embodiment, the p-type doped semiconductor layer includes GaN doped with Mg.

In a variation on this embodiment, the contact-assist metal layer comprises Pt or a Pt alloy which includes at least one of the following materials: Ru, Rh, Pd, Os, Ir, Zn, and Mg.

In a variation on this embodiment, the thickness of the contact-assist metal layer is at least 10 angstroms.

In a variation on this embodiment, the temperature for the annealing process is between 200° C. and 1000° C., the duration for the annealing process is approximately 5 minutes, and the annealing atmosphere includes at least one of the following: $N_2$, $O_2$, air, vacuum, and inert gases.

In a variation on this embodiment, the removal of the contact-assist metal layer involves chemical etching and/or mechanical grinding the contact-assist layer.

In a variation on this embodiment, the thickness of the reflective ohmic-contact metal layer is at lest 100 angstroms.

In a variation on this embodiment, the active layer includes at least one of the following materials: InGaN, InGaAlN, InGaAlP, and InGaAlAs.

In a variation on this embodiment, the conductive substrate includes at least one of the following materials: Si, GaAs, GaP, Cu, and Cr.

BRIEF DESCRIPTION OF THE FIGURES

FIG. 1A illustrates the cross-section of an exemplary lateral-electrode LED.

FIG. 1B illustrates the cross-section of an exemplary vertical-electrode LED.

FIG. 2 illustrates the cross-section of an exemplary vertical-electrode LED using p-side electrode as a reflector.

DETAILED DESCRIPTION

Figure 3A:
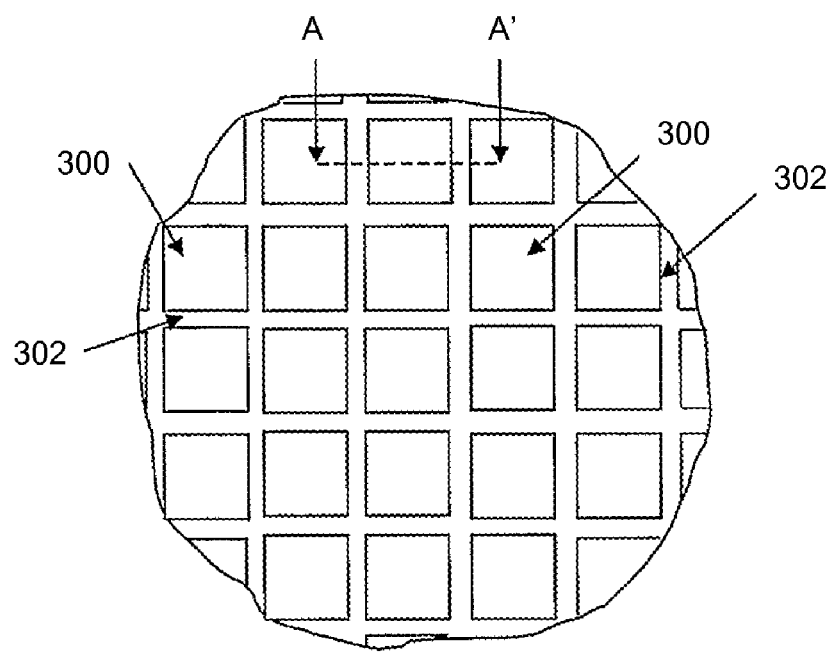
FIG. 3A illustrates part of a substrate with pre-patterned grooves and mesas in accordance with one embodiment.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the claims.

Overview

The recent developments in LED fabrication technology enable the use of GaN-based III-V compound semiconductors, which include AlGaN, InGaN, InGaAlN, and GaN, as materials for short-wavelength LED. These GaN-based LEDs not only extend the LED emission spectrum to the green, blue, and ultraviolet region, but also can achieve high light emission efficiency. In order to increase the light extraction efficiency, it is desirable to choose a highly reflective material as the contact layer for the p-side ohmic-electrode.

There exist only a few metal materials, such as silver (Ag) and aluminum (Al), which can provide high reflection to light whose spectrum ranges from green to violet. However, it is difficult for Ag or Al to form a good ohmic-contact with p-type doped GaN-based compound semiconductors, such as p-GaN, p-AlGaN, p-InGaN, and p-InGaAlN. On the other hand, metal materials, such as platinum (Pt), palladium (Pd), and nickel/gold (Ni/Au) alloy, which can form a low-resistance ohmic contact with the aforementioned p-doped GaN semiconductors, strongly absorb light in the desired spectrum range. Note that, the thicker the metal contact, the stronger the light absorption. One approach is to first deposit a thin layer of metal including Pt, Pd, or Ni/Au alloy on the p-type layer, and then deposit an Ag based reflective metal layer. To avoid excessive light absorption, the thickness of the Pt, Pd, or Ni/Au metal layer is typically less than 50 angstroms. However, when the thickness of the ohmic-contact metal layer is less than a few tens of angstroms, the contact characteristics degrades. Another approach is to first deposit a layer of transparent oxide, such as indium-tin-oxide (ITO), to form an ohmic-contact, and then deposit an Ag based reflective metal layer. However, Ag tends to be oxidized by the ITO and forms $AgO_2$, which in turn reduces the reflectivity of the Ag layer. In addition, the stability of the transparent oxide-based ohmic contact is not ideal.

Embodiments of the present invention provide a method for fabricating a highly reflective ohmic contact. After a multilayer semiconductor structure is fabricated on a growth substrate, a contact-assist metal layer is first formed on the p-type layer, and is later removed after thermal annealing. This annealing process effectively activates the p-type dopant in the p-type layer. A reflective ohmic-contact metal layer is then deposited on the p-type doped layer of the multilayer semiconductor structure after the removal of the contact-assist layer. A bonding layer is formed on the ohmic-contact metal layer to bond the multilayer structure with a conductive substrate. Subsequently, another ohmic-electrode is formed on the back of the conductive substrate. The highly reflective ohmic-contact layer not only exhibits superior ohmic-contact characteristic with the p-type doped semiconductor layer, but also exhibits high reflectivity to blue and green light.

Substrate Preparation

In order to grow a crack-free GaN-based III-V compound semiconductor multilayer structure on a large-area growth substrate (such as a Si wafer) to facilitate the mass production of high-quality, low-cost, short-wavelength LEDs, a growth method that pre-patterns the substrate with grooves and mesas is introduced. Pre-patterning the substrate with grooves and mesas can effectively release the stress built up in the multilayer structure that is caused by lattice-constant and thermal-expansion-coefficient mismatches between the substrate surface and the multilayer structure.

Figure 3B:
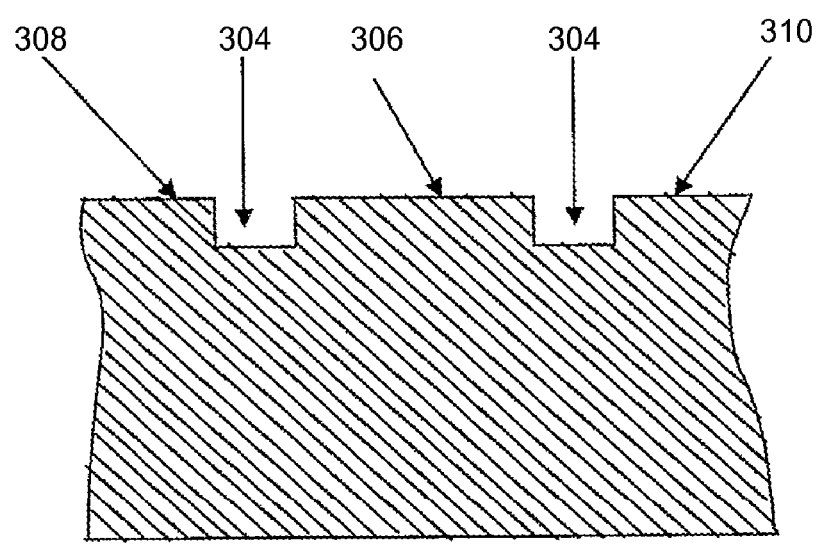
FIG. 3B illustrates the cross-section of the pre-patterned substrate in accordance with one embodiment.

FIG. 3A illustrates a top view of part of a substrate with a pre-etched pattern using photolithographic and plasma etching techniques in accordance with one embodiment. Square sections 300 and grooves 302 are the result of etching. FIG. 3B more clearly illustrates the structure of mesas and grooves by showing a cross-section of the pre-patterned substrate along a horizontal line A-A' in FIG. 3A in accordance with one embodiment. As seen in FIG. 3B, the sidewalls of intersecting grooves 304 effectively form the sidewalls of the isolated mesa structures, such as mesa 306, and partial mesas 308 and 310. Each mesa defines an independent surface area for growing a respective semiconductor device.

Note that it is possible to apply different lithographic and etching techniques to form the grooves and mesas on the semiconductor substrate. Also note that other than forming square mesas 300 as shown in FIG. 3A, alternative geometries can be formed by changing the patterns of grooves 302. Some of these alternative geometries can include, but are not limited to: triangle, rectangle, parallelogram, hexagon, circle, or other non-regular shapes.

Fabrication

Figure 4:
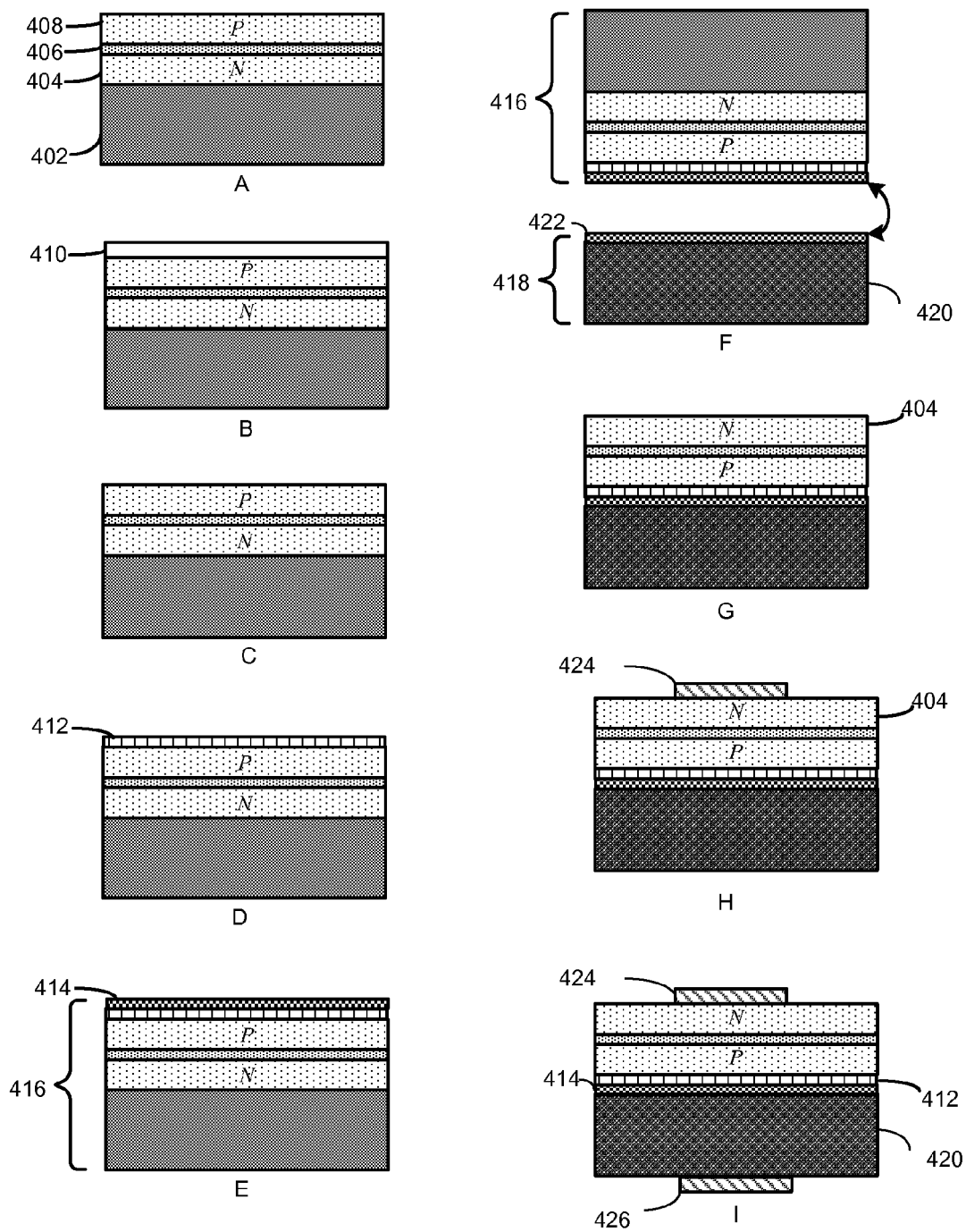
FIG. 4 presents a diagram illustrating the process of fabricating a light-emitting device with highly reflective ohmic-contact in accordance with one embodiment.

FIG. 4 presents a diagram illustrating the process of fabricating a light-emitting device with highly reflective ohmic contact in accordance with one embodiment. In operation A, after a pre-patterned growth substrate with grooves and mesas is prepared, an InGaN multilayer structure is formed using various growth techniques, which can include, but are not limited to: Metalorganic Chemical Vapor Deposition (MOCVD) and/or Molecular-beam Epitaxy (MBE). The LED structure can include a substrate layer 402, which can be a Si wafer, an n-type doped semiconductor layer 404, which can be a Si doped GaN layer, an active layer 406, which can include a five-period GaN/InGaN MQW structure, and a p-type doped semiconductor layer 408, which may be based on Mg doped GaN. Note that it is possible to reverse the growth sequence between the p-type layer and the n-type layer.

In operation B, a contact-assist metal layer 410 is formed on the top of the p-doped semiconductor layer. The metal materials that can be used to form contact-assist metal layer 410 include platinum (Pt) and/or Ni. Contact-assist metal layer 410 can also include at least one of the following materials: ruthenium (Ru), rhodium (Rh), palladium (Pd), osmium (Os), iridium (Ir), beryllium (Be), zinc (Zn), and magnesium (Mg). Contact-assist metal layer 410 can be deposited using, for example, an evaporation technique, such as electro-beam (e-beam) evaporation, or a sputtering technique. Other deposition techniques are also possible. In one embodiment, the thickness of the contact-assist metal layer is at least 10 angstroms. In a further embodiment, the contact-assist metal layer includes Pt, and is 500 angstroms thick.

In operation C, contact-assist metal layer 410 and the multilayer structure first undergo a thermal-annealing procedure, and is then removed using, for example, a mechanical grinding technique or a chemical etching technique. The thermal-annealing procedure activates the p-type ions in the p-type layer, and can result in a thin layer of semiconductor-metal alloy at the interface between the p-type layer and contact-assist layer 410. The atmosphere for the thermal-annealing procedure may include at least one of the following: Nitrogen ($N_2$), Oxygen ($O_2$), air, vacuum, and inert gases. The temperature for the thermal annealing can be between 200° C. and 1000° C. In one embodiment, the thermal annealing temperature is approximately 550° C. The total time used for the thermal annealing may be between 10 seconds and 24 hours. In one embodiment, the thermal annealing lasts for approximately 5 minutes. In one embodiment, the contact-assist metal layer is removed by dipping the multilayer structure in aqua-regia solution. After thermal annealing, although the contact-assist metal layer is removed, the semiconductor-metal alloy still remains, and can assist the formation of a good ohmic contact between a subsequently formed reflective layer based on Ag (or Al) and the p-type doped semiconductor layer 408 without incurring excessive light absorption. In addition, the formation and subsequent removal of the contact-assist metal layer can help improve the adhesiveness and the stability of the ohmic contact.

In operation D, a reflective ohmic-contact metal layer 412 is formed on the top of p-type doped layer 408. The metal materials used to form reflective ohmic-contact metal layer 412 can include Al, Ag, and alloys thereof. In addition, in order to enhance its mechanical stability, the reflective ohmic-contact metal layer may include at least one of the following materials: tungsten (W), copper (Cu), titanium (Ti), tantalum (Ta), and chromium (Cr). Similar to contact-assist metal layer 410, reflective ohmic-contact metal layer 412 can be deposited using an evaporation technique, such as electro-beam (e-beam) evaporation, or a sputtering technique. Other deposition techniques are also possible.

It is optional to perform a thermal-annealing procedure after the formation of reflective ohmic-contact metal layer 412. If thermal annealing is performed, the annealing temperature can be between 200° C. and 1000° C. In one embodiment, the annealing temperature is approximately 550° C. The total time used for the annealing period can be between 5 seconds and 120 minutes. In one embodiment, the thermal annealing lasts for approximately 1 minute. The annealing atmosphere includes at least one of the following: $N_2$, $O_2$, air, vacuum, and inert gases.

In operation E, a bonding layer 414 is formed on top of reflective ohmic-contact metal layer 412. Materials that are used to form bonding layer 414 may include gold (Au).

In operation F, the multilayer structure 416 is flipped upside down to bond with a supporting structure 418. In one embodiment, supporting structure 418 includes a conductive substrate layer 420 and a bonding layer 422. Bonding layer 422 may include Au. Conductive substrate layer 420 can include at least one of the following materials: Si, GaAs, GaP, Cu, and Cr.

In operation G, growth substrate 402 is removed by, for example, a mechanical grinding technique, or a chemical etching technique. The removal of growth substrate 402 exposes n-type layer 404.

In operation H, an electrode 424 (n-side electrode) is formed on top of n-type layer 404. In one embodiment, n-side electrode 424 includes Ti, Al, Ni, Au, and/or Au/Ge/Ni alloys.

N-side electrode 424 can be formed using, for example, an evaporation technique, such as e-beam evaporation, or a sputtering technique. Other deposition techniques are also possible.

In operation I, another electrode 426 (p-side electrode) is formed on the backside of conductive substrate 420. The material composition and the formation process of the electrode 426 can be similar to that for n-side electrode 424.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for fabricating a semiconductor light-emitting device, the method comprising:
   fabricating a multilayer semiconductor structure on a growth substrate, wherein the multilayer semiconductor structure comprises a first doped semiconductor layer, a second doped semiconductor layer, and a multi-quantum-wells (MQW) active layer;
   forming a contact-assist metal layer on the first doped semiconductor layer;
   annealing the multilayer structure to activate the first doped semiconductor layer;
   removing the contact-assist metal layer;
   forming a reflective ohmic-contact metal layer on the first doped semiconductor layer;
   forming a bonding layer coupled to the reflective ohmic-contact metal layer;
   bonding the multilayer structure to a conductive substrate;
   removing the growth substrate;
   forming a first electrode coupled to the conductive substrate;
   forming a second electrode on the second doped semiconductor layer.

2. The method of claim 1,
   wherein the growth substrate comprises a pre-defined pattern of grooves and mesas.

3. The method of claim 1,
   wherein the first doped semiconductor layer is a p-type doped semiconductor layer.

4. The method of claim 3,
   wherein the p-type doped semiconductor layer comprises GaN doped with Mg.

5. The method of claim 1,
   wherein the contact-assist metal layer comprises Pt or a Pt alloy which includes at least one of the following materials: Ru, Rh, Pd, Os, Ir, Zn, and Mg.

6. The method of claim 1,
   wherein the thickness of the contact-assist metal layer is at least 60 angstroms.

7. The method of claim 1,
   wherein temperature for the annealing process for the contact-assist metal layer is between 200° C. and 1000° C.;
   wherein the duration for the annealing process is approximately 5 minutes; and
   wherein the annealing atmosphere comprises at least one of the following:
   $N_2$,
   $O_2$,
   air,
   vacuum, and
   inert gases.

8. The method of claim 1, wherein removing the contact-assist metal layer involves chemical etching and/or mechanical grinding the contact-assist metal layer.

9. The method of claim 1, wherein the thickness of the reflective ohmic-contact metal layer is at least 100 angstroms.

10. The method of claim 1, wherein the active layer comprises at least one of the following materials:
    InGaN,
    InGaAlN,
    InGaAlP, and
    IaGaAlAs.

11. The method of claim 1, wherein the conductive substrate comprises at least one of the following materials:
    Si,
    GaAs,
    GaP,
    Cu, and
    Cr.

* * * * *